US012740492B2

(12) United States Patent
You

(10) Patent No.: US 12,740,492 B2
(45) Date of Patent: Sep. 15, 2026

(54) POWER MODULE

(71) Applicants: Hyundai Motor Company, Seoul (KR); Kia Corporation, Seoul (KR)

(72) Inventor: Myung Ill You, Gwangju (KR)

(73) Assignees: Hyundai Motor Company;, Seoul (KR); Kia Corporation, Seoul (KR)

( * ) Notice: Subject to any disclaimer, the term of this patent is extended or adjusted under 35 U.S.C. 154(b) by 738 days.

(21) Appl. No.: 18/134,966

(22) Filed: Apr. 14, 2023

(65) Prior Publication Data

US 2024/0128180 A1 Apr. 18, 2024

(30) Foreign Application Priority Data

Oct. 14, 2022 (KR) ........................ 10-2022-0132490

(51) Int. Cl.
*H10W 90/00* (2026.01)
*H10W 20/47* (2026.01)
*H10W 70/40* (2026.01)
*H10W 74/10* (2026.01)

(52) U.S. Cl.
CPC ......... *H10W 90/401* (2026.01); *H10W 20/47* (2026.01); *H10W 70/479* (2026.01); *H10W 74/129* (2026.01)

(58) Field of Classification Search
CPC ... H10W 90/00; H10W 90/401; H10W 20/47; H10W 70/479; H10W 74/129
See application file for complete search history.

(56) References Cited

U.S. PATENT DOCUMENTS 9,412,679 B1 * 8/2016 Nakahara ................ H01L 23/24
10,037,977 B2 * 7/2018 Lei ........................ H10W 90/00
2003/0151128 A1 * 8/2003 Kawaguchi ........... H01L 25/165 257/691
2009/0116197 A1 * 5/2009 Funakoshi .......... H10W 40/778 438/122
2012/0256194 A1 * 10/2012 Yoshihara ............... H01L 25/18 257/77
2018/0145603 A1 * 5/2018 Kim ................... H05K 7/20845
2021/0313256 A1 * 10/2021 McPherson ........... H01L 23/053
2024/0290698 A1 * 8/2024 Masuda ................ H01L 25/072

FOREIGN PATENT DOCUMENTS

KR 10-2017-0071142 6/2017
KR 10-2018-0058311 6/2018

* cited by examiner

*Primary Examiner* — John M Parker
(74) *Attorney, Agent, or Firm* — MORGAN, LEWIS & BOCKIUS LLP

(57) ABSTRACT

A power module makes it possible to simplify an assembly process by disposing a compact, unified insulating substrate in a single casing, reduce overall size by selectively applying the insulating substrate according to specifications of the power module, and improve reliability by preventing a decrease in lifespan due to heat as the size of the insulating substrate is reduced. In other words, by placing the compact, unified insulating substrate in parallel in the casing, the assembly process of the insulating substrate may be facilitated, and as the size of the insulating substrate is reduced, the performance and reliability of the power module can be improved.

13 Claims, 9 Drawing Sheets

POWER MODULE

CROSS REFERENCE TO RELATED APPLICATION

The present application claims priority to Korean Patent Application No. 10-2022-0132490, filed Oct. 14, 2022, the entire contents of which is incorporated herein for all purposes by this reference.

BACKGROUND OF THE PRESENT DISCLOSURE

Field of the Present Disclosure

The present disclosure relates to a power module that simplifies an assembly process by disposing a compact, unified insulating substrate in a single casing, reduces overall size by selectively applying the insulating substrate according to specifications of the power module, and improves reliability by preventing a decrease in lifespan due to heat as the size of the insulating substrate is reduced.

Description of Related Art

A power conversion device (for example, an inverter), which is one of the main components of hybrid and electric vehicles, is a major part of eco-friendly vehicles, and many related technologies are being developed. The development of a power module, which is an essential component of power conversion devices and accounts for the largest portion of the manufacturing cost, is a key agenda in the eco-friendly vehicle field.

In the case of a double-sided cooling power module, electrical connection between upper and lower substrates is required for circuit configuration. In the instant case, a via spacer is used to electrically connect the upper substrate and the lower substrate. At the instant time, the upper substrate and the lower substrate become insulating substrates.

Accordingly, in the conventional double-sided cooling power module, an insulating substrate is applied for electrical insulation and mechanical protection, and the overall size is determined according to the size of the insulating substrate.

However, in the case of the conventional power module, as the size of the insulating substrate becomes fixed, there is a durability problem due to the high temperature occurred during chip operation. Moreover, covering various specifications is not possible and the overall size becomes unnecessarily large.

The information included in this Background of the present disclosure is only for enhancement of understanding of the general background of the present disclosure and may not be taken as an acknowledgement or any form of suggestion that this information forms the prior art already known to a person skilled in the art.

BRIEF SUMMARY

Various aspects of the present disclosure are directed to providing a power module that simplifies an assembly process by assembling a compact, unified insulating substrate into a single casing, reduces overall size by selectively applying the insulating substrate according to specifications of the power module, and improves reliability by preventing a decrease in lifespan due to heat as the size of the insulating substrate is reduced.

In various aspects of the present disclosures, according to various exemplary embodiments of the present disclosure, there is provided a power module, including: insulating substrates, to each of which a corresponding chip is bonded; and a casing provided with mounting portions into which the insulating substrates are respectively inserted, and provided with a bus bar electrically connected to the insulating substrates inserted into the mounting portions, wherein the mounting portions may be provided to support the insulating substrates.

The mounting portions may be arranged in a straight line in the casing, and the bus bar may be provided to extend in a direction in which the mounting portions are arranged.

The insulating substrates and the bus bar may be electrically connected to each other via connection portions to form an electric circuit therebetween.

The bus bar may be provided each on a first side and a second side of the casing and may be electrically connected to the insulating substrates respectively inserted into the mounting portions.

Any one insulating substrate may be electrically connected to the bus bar on the first side via a connection portion among the connection portions, the insulating substrate electrically connected to the bus bar may be connected to another insulating substrate via a connection portion among the connection portions, and the another insulating substrate may be electrically connected to the bus bar on the second side thereof.

The casing may be configured in plurality and combined to be stacked, and the casings may be spaced apart in a stacking direction so that the respective insulating substrates of the casings do not come into contact with each other.

A plurality of protruding end portions may be formed along a periphery of each of the casings, and when the casings are combined, the respective protruding end portions of the casings may be matched.

In a state in which the casings are combined, the respective bus bars of the casings may be disposed to cross each other in the stacking direction thereof.

A plurality of signal pins may be provided in the casing, and the plurality of signal pins may be spaced from the bus bar.

The bus bar may be disposed each on a first side and a second side of the casing, and the signal pins may be spaced in a direction perpendicular to a direction where the bus bar is disposed.

The casing may be molded with the insulating substrates inserted into the mounting portions to be internally insulated.

Meanwhile, a power module according to various exemplary embodiments of the present disclosure may include a lower casing provided with a plurality of first mounting portions into which a plurality of first insulating substrates to which chips are bonded are inserted, and provided with a first bus bar electrically connected to the first insulating substrates inserted into the first mounting portions; and an upper casing provided with a plurality of second mounting portions into which a plurality of second insulating substrates to which chips are bonded are inserted, and provided with a second bus bar electrically connected to the second insulating substrates inserted into the second mounting portions, wherein the lower casing and the upper casing may be vertically coupled.

In the lower casing, the first insulating substrates and the first bus bar may be electrically connected to each other via connection portions, while in the upper casing, the second insulating substrates and the second bus bar may be electrically connected to each other via connection portions.

The first bus bar may be provided each on a first side and a second side of the lower casing, while the second bus bar may be provided each on a first side and a second other side of the upper casing, and the first bus bar and the second bus bar may be disposed to cross each other in a vertical direction thereof.

A plurality of signal pins may be provided in the lower casing and the upper casing, and the plurality of signal pins may be disposed in a direction perpendicular to the first bus bar and the second bus bar.

As described above, according to a power module of the present disclosure, it is possible to simplify an assembly process by disposing a compact, unified insulating substrate in a single casing, reduce overall size by selectively applying the insulating substrate according to specifications of the power module, and improve reliability by preventing a decrease in lifespan due to heat as the size of the insulating substrate is reduced.

In other words, by placing the compact, unified insulating substrate in parallel in the casing, the assembly process of the insulating substrate may be facilitated, and as the size of the insulating substrate is reduced, the performance and reliability of the power module may be improved.

The methods and apparatuses of the present disclosure have other features and advantages which will be apparent from or are set forth in more detail in the accompanying drawings, which are incorporated herein, and the following Detailed Description, which together serve to explain certain principles of the present disclosure.

BRIEF DESCRIPTION OF THE DRAWINGS

FIG. 4 is a view showing a casing of the power module shown in FIG. 1;

FIG. 7 is a view showing a power module according to various exemplary embodiments of the present disclosure;

Figure 1:
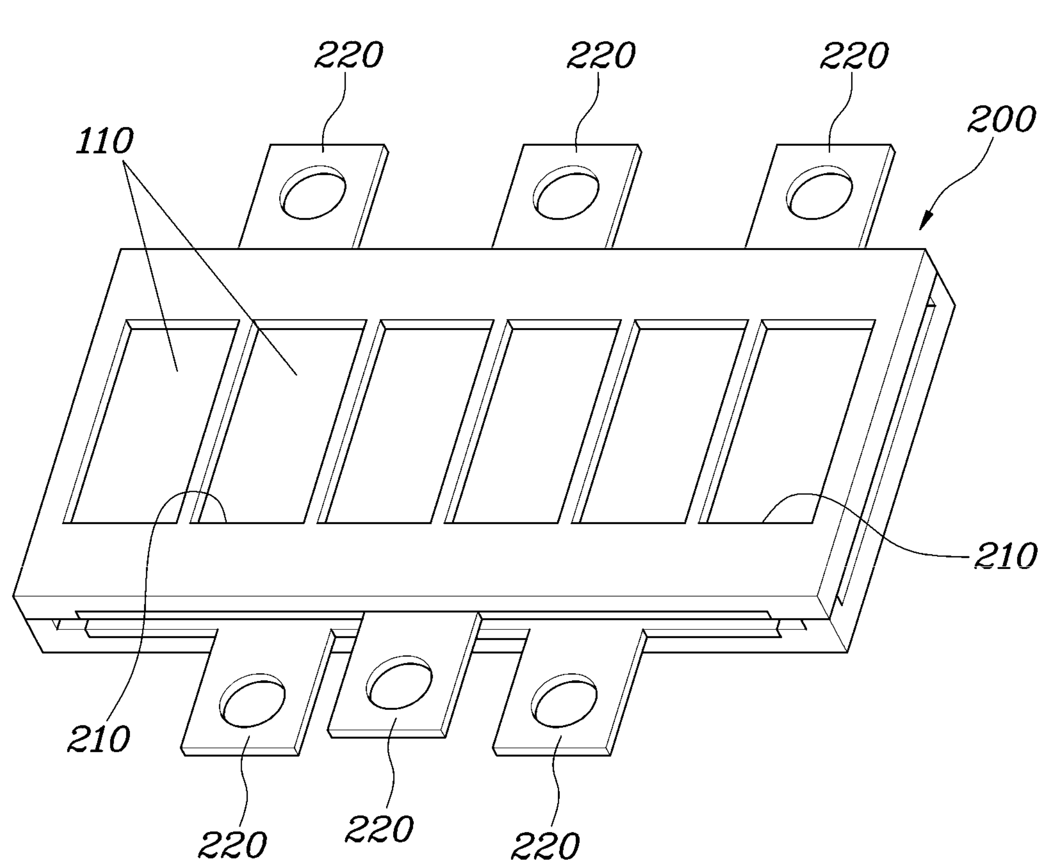
FIG. 1 is a view showing a power module according to various exemplary embodiments of the present disclosure.

It may be understood that the appended drawings are not necessarily to scale, presenting a somewhat simplified representation of various features illustrative of the basic principles of the present disclosure. The specific design features of the present disclosure as included herein, including, for example, specific dimensions, orientations, locations, and shapes will be determined in part by the particularly intended application and use environment.

In the figures, reference numbers refer to the same or equivalent parts of the present disclosure throughout the several figures of the drawing.

DETAILED DESCRIPTION

Reference will now be made in detail to various embodiments of the present disclosure(s), examples of which are illustrated in the accompanying drawings and described below. While the present disclosure(s) will be described in conjunction with exemplary embodiments of the present disclosure, it will be understood that the present description is not intended to limit the present disclosure(s) to those exemplary embodiments of the present disclosure. On the other hand, the present disclosure(s) is/are intended to cover not only the exemplary embodiments of the present disclosure, but also various alternatives, modifications, equivalents and other embodiments, which may be included within the spirit and scope of the present disclosure as defined by the appended claims.

Hereinafter, embodiments included in the present specification will be described in detail with reference to the accompanying drawings, with the same or similar elements being assigned the same reference numerals regardless of numerals used in the drawings, and overlapping descriptions thereof will be omitted.

The suffixes "module" and "part" for the elements used in the following description are provided or mixed in consideration of only the ease of writing the specification, and do not have distinct meanings or roles by themselves.

In describing the exemplary embodiments included in the present specification, if it is determined that detailed descriptions of related known technologies may obscure the gist of the exemplary embodiments included in the present specification, the detailed description thereof will be omitted. Furthermore, it should be understood that the accompanying drawings are only for easy understanding of the exemplary embodiments included in the present specification, and the technical idea included in the present specification is not limited by the accompanying drawings, and the present disclosure covers all changes, equivalents and substitutes within the spirit and scope of the present disclosure.

Terms including an ordinal number, such as first, second, etc., may be used to describe various elements, but the elements are not limited by the terms. These terms are used only for distinguishing one element from another.

When an element is referred to as being "connected" to another element, it should be understood that the other element may be directly connected to the other element, but other element(s) may exist in between. On the other hand, when it is said that a certain element is "directly connected" to another element, it should be understood that no other element is present in the middle.

The singular expression includes the plural expression unless the context clearly dictates otherwise.

In the present specification, the terms "comprise", "include", or "have" are intended to indicate that there is a feature, number, step, action, element, portion, or combination thereof described on the specification, and it is to be understood that the present disclosure does not exclude the possibility of the presence or the addition of one or more other features, numbers, steps, actions, elements, portions, or combinations thereof.

A controller may include a communication device that communicates with other controllers or sensors to control the functions in charge, an operating system, a memory that stores logic commands and input/output information, and one or more processors that perform judgments, calculations, decisions, etc. necessary to control the functions in charge.

Hereinafter, a power module according to various exemplary embodiments of the present disclosure will be described with reference to the accompanying drawings.

Figure 2:
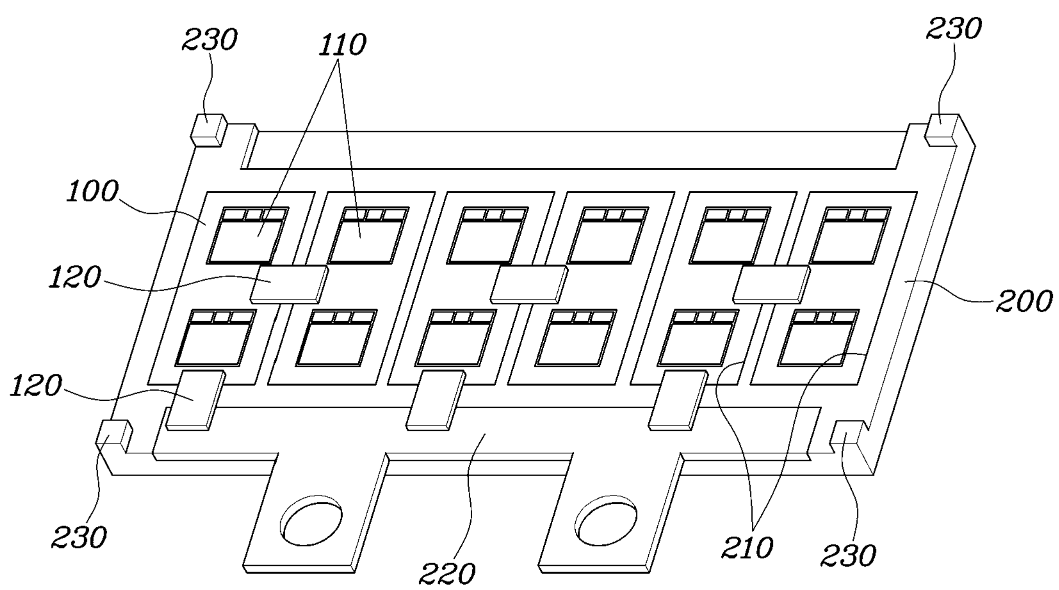
FIG. 2 is a view showing any one side of the power module shown in FIG. 1.
Figure 3:
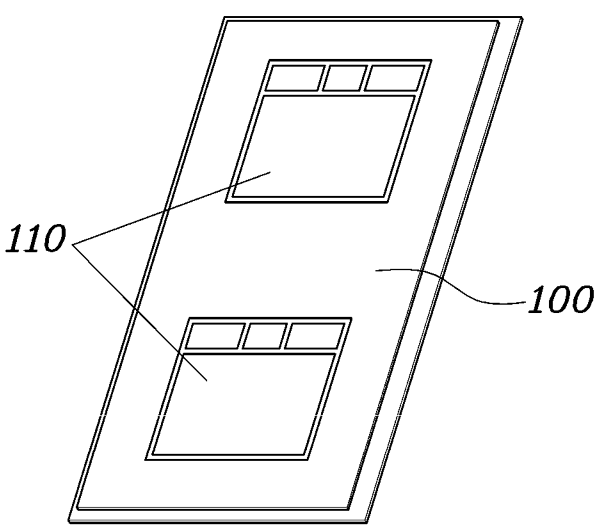
FIG. 3 is a view showing an insulating substrate of the power module shown in FIG. 1.
Figure 4:
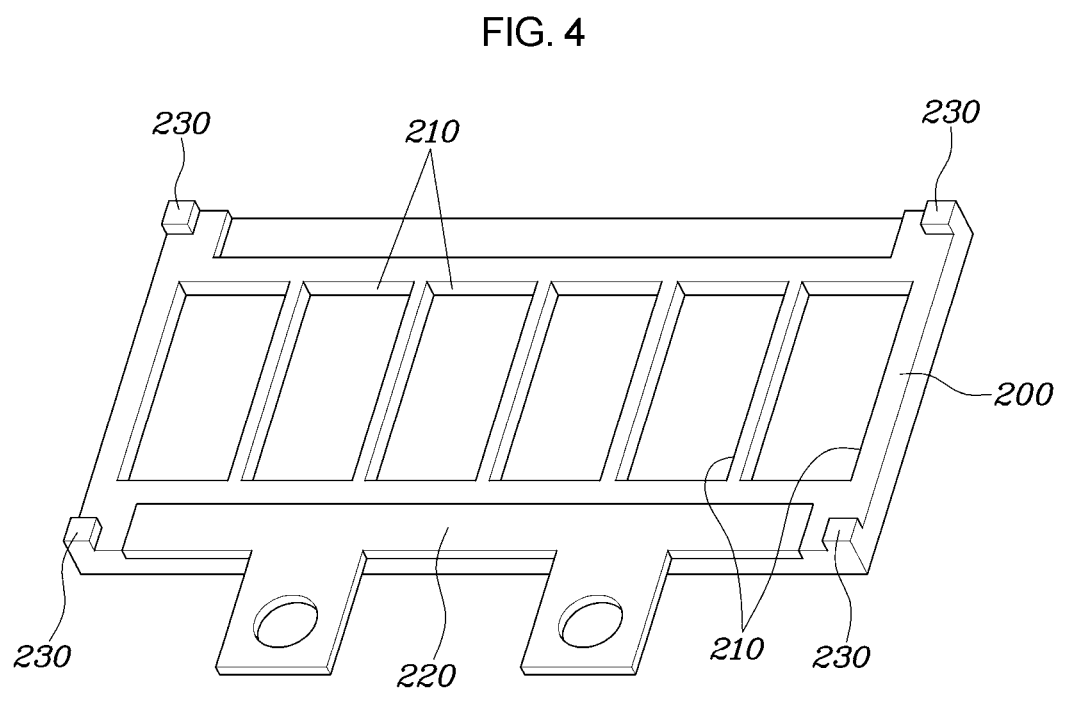

FIG. 1 is a view showing a power module according to various exemplary embodiments of the present disclosure, FIG. 2 is a view showing any one side of the power module shown in FIG. 1, FIG. 3 is a view showing an insulating substrate of the power module shown in FIG. 1, and FIG. 4 is a view showing a casing of the power module shown in FIG. 1.

Figure 5:
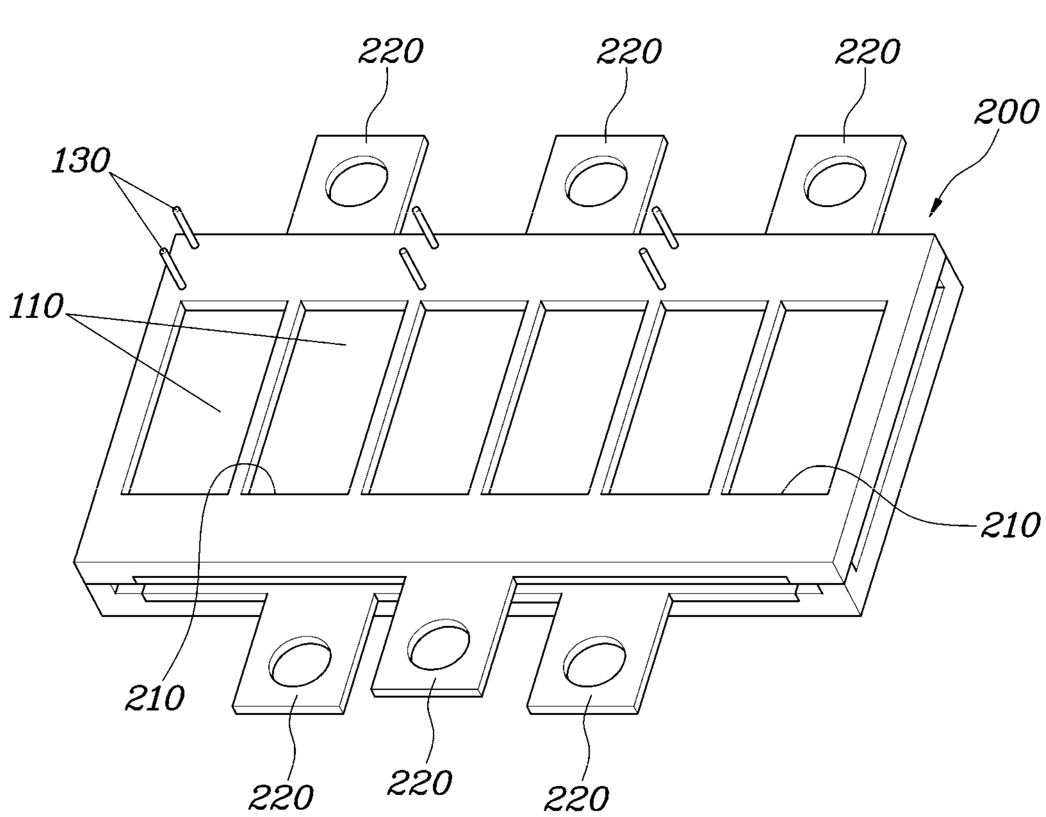
FIG. 5 is a view showing an example of a signal pin in the casing of the power module shown in FIG. 1.
Figure 6:
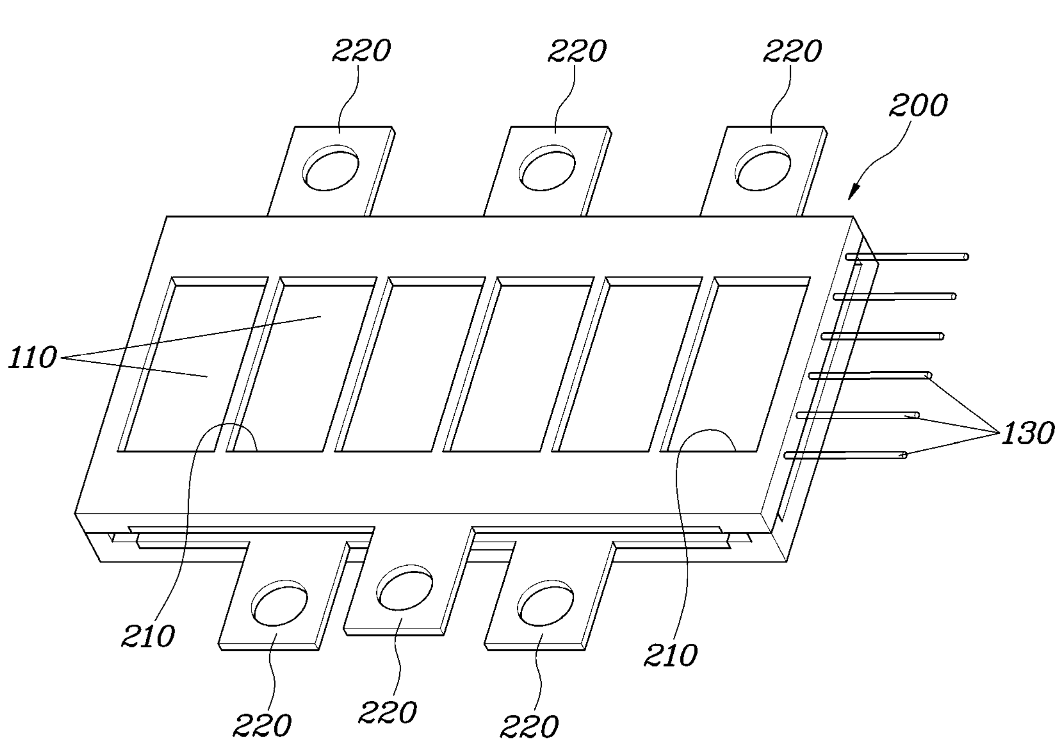
FIG. 6 is a view showing another example of the signal pin in the casing of the power module shown in FIG. 1.

Meanwhile, FIG. 5 is a view showing an example of a signal pin in the casing of the power module shown in FIG. 1, and FIG. 6 is a view showing another example of the signal pin in the casing of the power module shown in FIG. 1.

Figure 7:
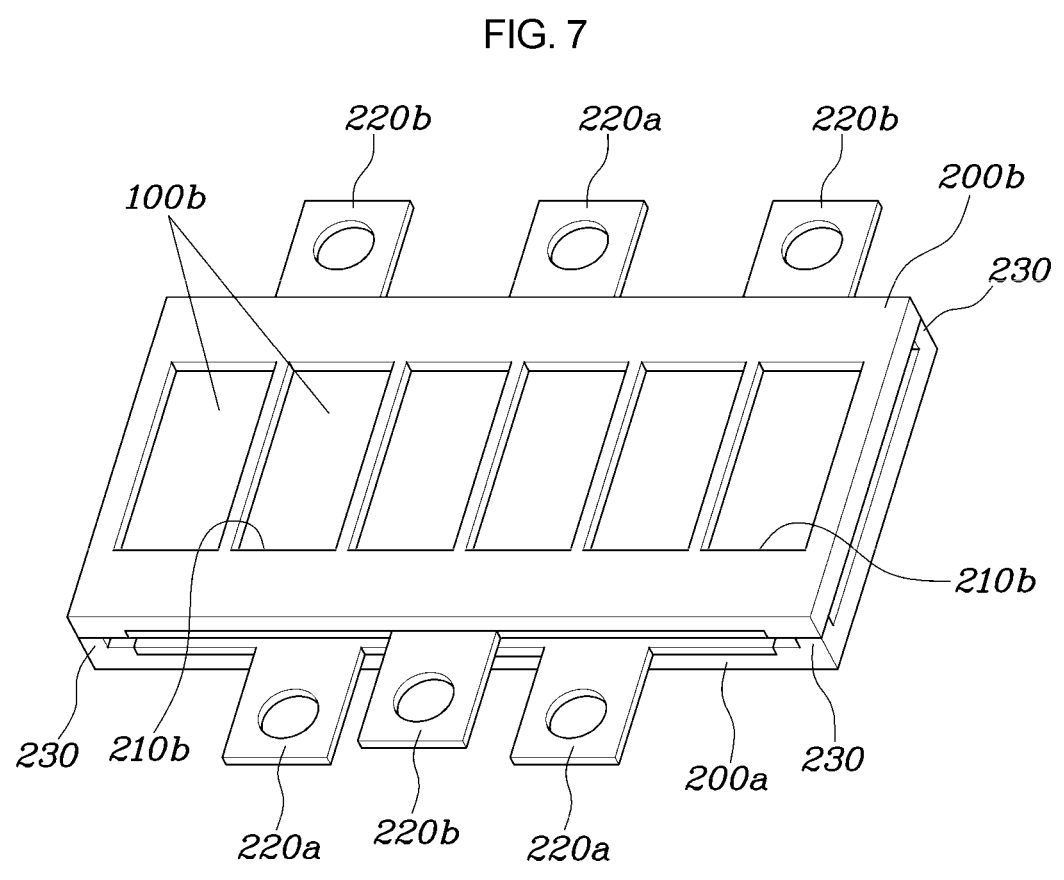
Figure 8:
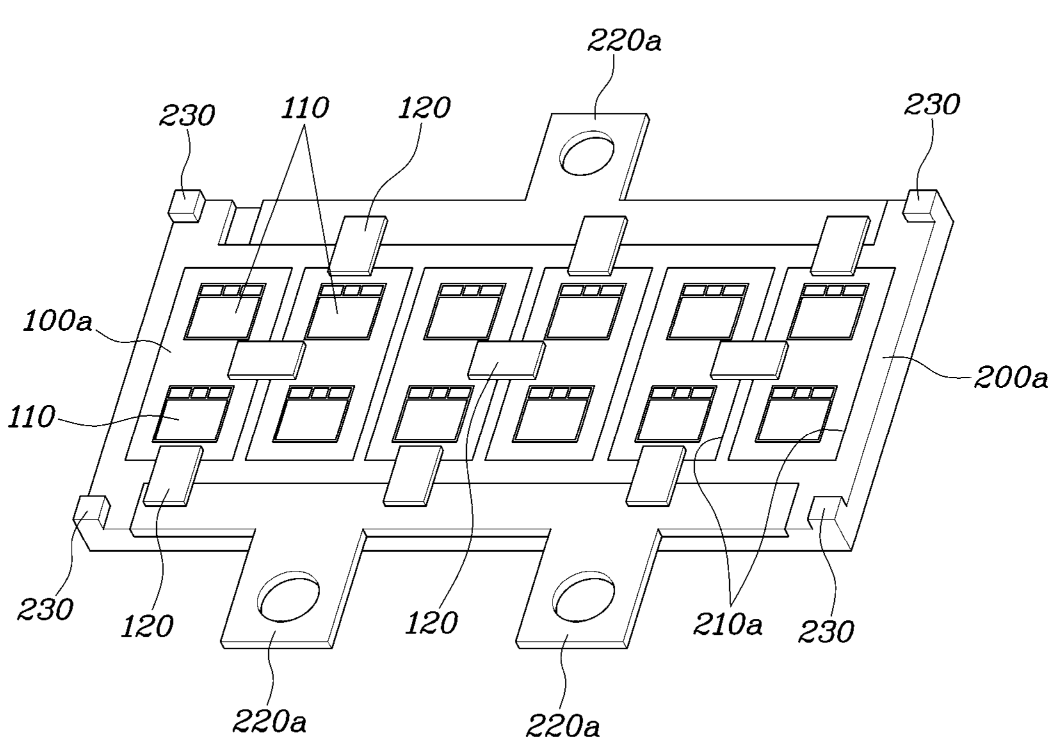
FIG. 8 is a view showing a first insulating substrate and a lower casing of the power module shown in FIG. 7.
Figure 9:
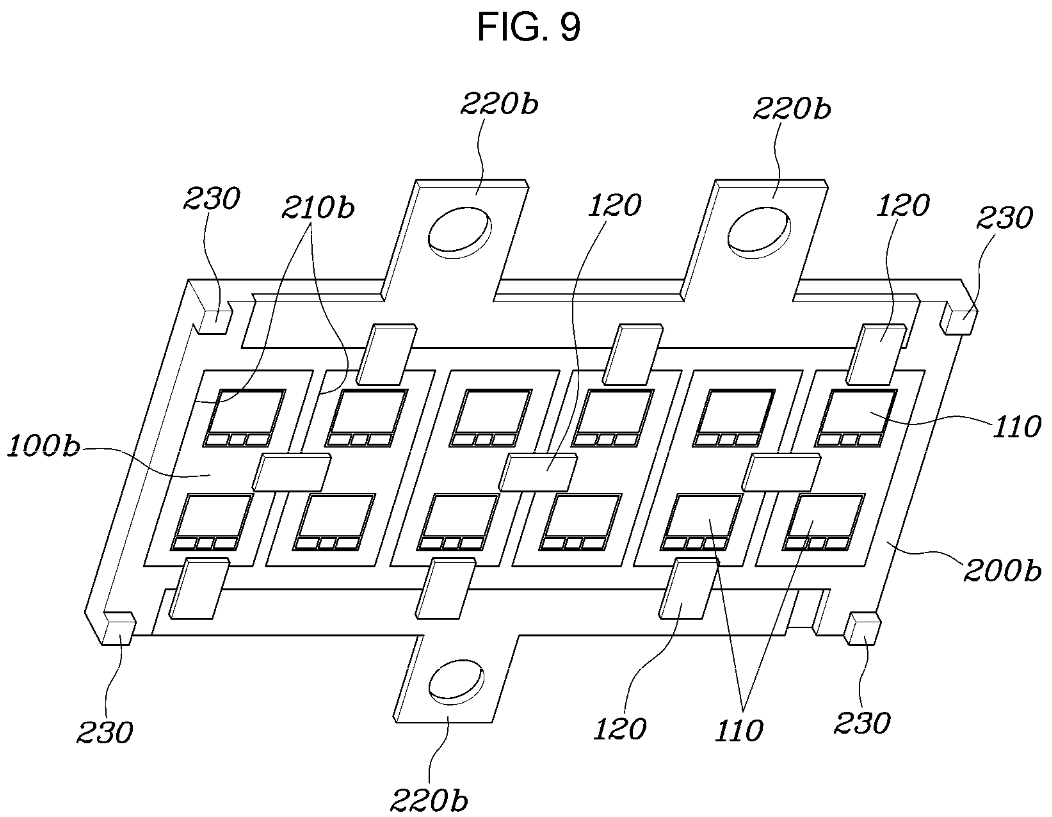
FIG. 9 is a view showing a second insulating substrate and an upper casing of the power module shown in FIG. 7.

FIG. 7 is a view showing a power module according to various exemplary embodiments of the present disclosure, FIG. 8 is a view showing a first insulating substrate and a lower casing of the power module shown in FIG. 7, and FIG. 9 is a view showing a second insulating substrate and an upper casing of the power module shown in FIG. 7.

As shown in FIG. 1, FIG. 2, FIG. 3, and FIG. 4, a power module according to various exemplary embodiments of the present disclosure may include insulating substrates 100 to each of which a chip 110 is bonded; and a casing 200 in which mounting portions 210 into which the insulating substrates 100 are inserted are formed, and in which a bus bar 220 electrically connected to the insulating substrates 100 inserted into the mounting portions 210 is provided, wherein the mounting portions 210 are provided to support the insulating substrates 100.

The casing 200 may be molded with the insulating substrates 100 inserted into the mounting portions 210 to be internally insulated.

The insulating substrate 100 according to the exemplary embodiment of the present disclosure is miniaturized and a portion of the chip 110 forming an inverter is bonded. In the present way, as the size of the insulating substrate 100 is reduced, bending deformation of the insulating substrate 100 due to high temperature caused by heat generated in the chip 110 is prevented, and overall durability and reliability are improved.

Accordingly, as can be seen in FIG. 3, the chip 110 is mounted on the miniaturized insulating substrate 100, but the chip 110 may be mounted within a range in which bending deformation of the insulating substrate 100 is prevented.

That is, in the case of a power module, the number of chips 110 needs to be increased to cover the amount of power required as the system is integrated for high specification and cost reduction, and as the power module performance is improved. However, in the conventional case, as the number of chips 110 increases, the size of the insulating substrate 100 for covering the chips 110 also needs to be increased. Thus, with the integration of the chip 110, bending deformation of the insulating substrate 100 occurs due to the high temperature caused by heat generated during the operation of the chip 110, which is problematic.

In various aspects of the present disclosure, the insulating substrate 100 to which the chip 110 is bonded is miniaturized and the miniaturized individual insulating substrates 100 are mounted to the casing 200.

Accordingly, as can be seen in FIG. 4, the casing 200 is provided with the mounting portion 210 into which the insulating substrate 100 is inserted, and provided with the bus bar 220 electrically connected to the insulating substrate 100 inserted into the mounting portion 210.

The insulating substrate 100 and the casing 200 may be molded in a state where they are bonded to each other so that the inside thereof is insulated and integrated.

In an exemplary embodiment of the present disclosure, two chips 110 are mounted on one insulating substrate 100, but the number of chips 110 may be changed according to the specifications required by the inverter.

To describe the present disclosure in detail, a plurality of mounting portions 210 may be disposed in a straight line in the casing 200, and the bus bar 220 may be provided to extend in a direction in which the plurality of mounting portions 210 are arranged.

In the case of the insulating substrate 100, it may be configured in plurality according to the required specifications of the inverter, and the mounting portion 210 of the casing 200 may be formed in the same number according to the number of insulating substrates 100 so that a plurality of insulating substrates 100 may be mounted.

At the present time, in the casing 200, although the number of mounting portions 210 may be further increased to be sufficient and the number of insulating substrates 100 may be adjusted to be selectively mounted on each mounting portion 210, it is preferable to match the number of mounting portions to the number of insulating substrates 100 so that the size of the casing 200 may be reduced as much as possible.

Furthermore, in the casing 200, the mounting portions 210 may be disposed in a straight line, and the bus bar 220 may be provided to extend in a direction in which the plurality of mounting portions 210 are arranged. Due to the provided configuration, the process is simplified as it is easy to insert the insulating substrate 100 by aligning it with the mounting portion 210 of the casing 200, and it is easy to configure the bus bar 220 so that the plurality of insulating substrates 100 inserted into the mounting portions 210 are electrically connected to each other.

Of course, the mounting position of the insulating substrate 100 may be variously configured by diversifying the shape of the casing 200. However, in that case, the manufacturing process of the casing 200 and the bus bar 220 becomes complicated, and difficulty may arise in accurately assembling the insulating substrate 100 to each mounting portion 210.

Therefore, the mounting portion 210 of the casing 200 is formed to be arranged in a straight line, and the bus bar 220 is also provided to extend in a straight line.

Meanwhile, as may be seen in FIG. 2, the plurality of insulating substrates 100 and the bus bar 220 may be electrically connected via corresponding connection portion 120 to form an electric circuit therebetween.

The connection portion 120 may include a clip, a spacer, etc., and depending on the position of the connection portion 120, the insulating substrate 100 and the bus bar 220 may be electrically connected to form an electric circuit therebetween. That is, each insulating substrate 100 and the bus bar 220 are mounted to be spaced from each other in the casing 200, and by allowing the connection portion 120 to electrically connect between insulating substrates 100 or connect the insulating substrate 100 and the bus bar 220, a current flow may be formed along the insulating substrates 100 and the bus bar 220 in the casing 200.

The connection portion 120 may be fixed in position in the casing 200 by bonding or fastening, and is insulated together when the insulating substrate 100 and the casing 200 are molded.

Meanwhile, the bus bars 220 may be respectively provided on one side and the other side of the casing 200 to be electrically connected to the insulating substrate 100 inserted into each mounting portion 210.

In the case of the bus bar 220, bus bars 220 such as P-type, N-type, and output may be configured, and each bus bar 220 should be spaced from each other to prevent a short circuit.

At the instant time, when bus bars 220 are disposed on any one side of the casing 200, electrical damage may occur due to a short circuit, and thus each bus bar 220 is disposed to be distributed to one side and the other side of the casing 200.

Accordingly, as various exemplary embodiments of the present disclosure, any one insulating substrate 100 may be electrically connected to the bus bar 220 on one side via the connection portion 120, the insulating substrate 100 electrically connected to the bus bar 220 may be connected to the other insulating substrate 100 via the connection portion 120, and the other insulating substrate 100 may be electrically connected to the bus bar 220 on the other side thereof.

The plurality of insulating substrates 100 are provided in the casing 200, and each insulating substrate 100 is electrically connected via the connection portion 120 to form a circuit. Accordingly, when all the insulating substrates 100 provided in the casing 200 are electrically connected via the connection portions 120 as a medium, one inverter is configured. Furthermore, a plurality of inverters may be configured by selectively connecting some of the insulating substrates 100 among the plurality of insulating substrates 100.

As an exemplary embodiment of the present disclosure, as shown in FIG. 2, when six insulating substrates 100 are provided in the casing 200, one circuit is configured by electrically connecting one insulating substrate 100 and the other insulating substrate 100 adjacent to each other via the connection portion 120, and regarding the remaining insulating substrates 100, two pairs of insulating substrates 100 may be connected via the connection portions 120 to form a total of three circuits. That is, a plurality of inverters may be configured in one casing 200, and each chip 110 may be configured to drive a driver by switching through pulse width modulation control.

This is merely according to an exemplary embodiment of the present disclosure, and the number of insulating substrates 100 and mounting portions 210 provided in the casing 200 may be set differently according to the inverter specifications, and the bus bar 220 may be configured in plurality to diversify each circuit.

Meanwhile, the casing 200 may be configured in plurality and combined to be stacked, and may be coupled to be spaced from each other so that the respective insulating substrates 100 of the casings 200 do not come into contact with each other in the stacking direction thereof.

In the present way, when the plurality of casings 200 are configured, the circuits of the insulating substrates 100 provided in each casing 200 may be diversified. Furthermore, the insulating substrates 100 provided in each casing 200 may be connected via the bus bar 220 or a separate spacer to form a current flow in the chip 110 provided in each insulating substrate 100, and due to the formation of the current flow, a plurality of inverters may be configured.

Furthermore, since the casings 200 are stacked when a plurality of casings are configured, an overall size increase may be minimized even if the plurality of casings 200 are provided.

Meanwhile, a plurality of protruding end portions 230 are formed along the periphery of the casing 200, and when the plurality of casings 200 are combined, the respective protruding end portions 230 of the casings 200 may be matched.

As can be seen in FIG. 1 and FIG. 2, the casing 200 has the protruding end portions 230 formed therein, and the plurality of protruding end portions 230 are provided along the periphery at positions not interfering with the mounting portions 210. The protruding end portion 230 is formed at the vertex of the casing 200 to avoid interference with other components including the insulating substrate 100, the connection portion 120, and the bus bar 220.

Furthermore, since the protruding end portions 230 are provided in each casing 200, when the casings 200 are combined, the protruding end portions 230 of one casing 200 are matched with the protruding end portions 230 of the other casing 200, so that the insulating substrates 100 provided in one casing 200 may be spaced apart so as not to be in direct contact with the insulating substrates 100 provided in the other casing 200 to avoid electrical damage.

Meanwhile, in a state in which the casings 200 are combined, the respective bus bars 220 of the casings 200 may be arranged to cross each other in the stacking direction thereof.

That is, in an exemplary embodiment of the present disclosure, the bus bars 220 are provided for each casing 200, and unintentional connection between the bus bars 220 should be prevented. Accordingly, as may be seen in FIG. 1, the respective bus bars 220 of the casings 200 are arranged to cross each other so as not to overlap in the stacking direction, so that the individual bus bars 220 are spaced apart.

Meanwhile, a plurality of signal pins 130 may be provided in the casing 200, and the plurality of signal pins 130 may be spaced from the bus bar 220.

The bus bar 220 may be disposed on one side and the other side of the casing 200, and the signal pins 130 may be spaced in a direction perpendicular to the direction where the bus bar 220 is disposed.

In an exemplary embodiment of the present disclosure, the bus bar 220 is configured to apply power to each chip 110, and the signal pin 130 is configured to provide a control signal to each chip 110.

Accordingly, the signal pin 130 is for inputting a command signal to each chip 110 provided on the insulating substrate 100, and the signal pins 130 are spaced from each other to prevent an error occurring during signal transmission.

Not only the signal pins 130 but also the bus bars 220 should be spaced from each other to prevent a signal transmission error and electrical damage.

Accordingly, in an exemplary embodiment of the present disclosure, each bus bar 220 is disposed on one side and the other side of the casing 200 to avoid contact, and the signal pins 130 are spaced from each other in a direction perpendicular to the bus bar 220 in the casing 200. At the instant time, the perpendicular direction includes the lateral direction and the vertical direction with respect to the bus bar 220, and by disposing the signal pins 130 to extend vertically from the bus bar 220 to the up-down direction of the drawing as shown in FIG. 5, or by disposing the signal pins 130 to extend vertically from the bus bar 220 to the left-right side of the drawing, the bus bars 220 and the signal pins 130 may be configured to avoid contact with each other.

Meanwhile, as shown in FIGS. 7 to 9, a power module according to an exemplary embodiment of the present disclosure may include: a lower casing 200*a* in which a plurality of first mounting portions 210*a* into which a plurality of first insulating substrates 100*a* to which the chips 110 are bonded are inserted are formed, and provided with a first bus bar 220*a* electrically connected to the first insulating substrates 100*a* inserted into the first mounting portions 210*a*; and an upper casing 200*b* in which a plurality of second mounting portions 210*b* into which a plurality of second insulating substrates 100*b* to which the chips 110 are bonded are inserted are formed, and provided with a second bus bar 220*b* electrically connected to the second insulating substrates 100*b* inserted into the second mounting portions 210*b*.

The lower casing 200*a* and the upper casing 200*b* may be vertically coupled.

In the lower casing 200*a*, the plurality of first insulating substrates 100*a* and the first bus bar 220*a* may be electrically connected to each other via the connection portions 120. In the same way, in the upper casing 200*b*, the plurality of second insulating substrates 100*a* and the second bus bar 220*b* may be electrically connected to each other via the connection portions 120.

That is, the first insulating substrates 100*a* and the first bus bar 220*a*, and the second insulating substrates 100*b* and the second bus bar 220*b* are mounted to be spaced from each other in the casing 200. At the instant time, the lower casing 200*a* and the upper casing 200*b* are both provided with the connection portions 120, so that the first insulating substrates 100*a* may be electrically connected to each other or the first insulating substrate 100*a* and the first bus bar 220*a* may be electrically connected in the lower casing 200*a*, while the second insulating substrates 100*b* may be electrically connected to each other or the second insulating substrate 100*b* and the second bus bar 220*b* may be electrically connected in the upper casing 200*b*. Accordingly, in the lower casing 200*a* and the upper casing 200*b*, the insulating substrates 100 are electrically connected via the connection portions 120 to configure a circuit according to the current flow.

Meanwhile, the first bus bar 220*a* is provided on one side and the other side of the lower casing 200*a*, while the second bus bar 220*b* is provided on one side and the other side of the upper casing 200*b*. The first bus bar 220*a* and the second bus bar 220*b* may be disposed to cross each other in the vertical direction thereof.

Furthermore, the plurality of signal pins 130 are provided in the lower casing 200*a* and the upper casing 200*b*, and the plurality of signal pins 130 may be disposed in a direction perpendicular to the first bus bar 220*a* and the second bus bar 220*b*.

Accordingly, the first bus bar 220*a*, the second bus bar 220*b*, and the signal pins 130 are spaced apart to avoid contact.

As described above, in the power module according to the exemplary embodiment of the present disclosure, the lower casing 200*a* and the upper casing 200*b* are configured, and as the lower casing 200*a* and the upper casing 200*b* are combined, circuits may be diversified due to the first insulating substrates 100*a* and the second insulating substrates 100*b*.

That is, a current flow is formed in the chips 110 mounted on the first insulating substrates 100*a* provided in the lower casing 200*a* by the first bus bars 220*a* and the connection portions 120 to form one circuit, and a current flow is formed in the chips 110 mounted on the second insulating substrates 100*b* provided in the upper casing 200*b* by the second bus bars 220*b* and the connection portions 120 to form another circuit. Furthermore, the circuits may be connected and integrated.

Furthermore, since the lower casing 200*a* and the upper casing 200*b* are stacked vertically, an overall size increase may be minimized when the lower casing 200*a* and the upper casing 200*b* are stacked.

The power module including the structure as described above makes it possible to simplify an assembly process by disposing a compact, unified insulating substrate 100 in a single casing 200, reduce overall size by selectively applying the insulating substrate 100 according to specifications of the power module, and improve reliability by preventing a decrease in lifespan due to heat as the size of the insulating substrate 100 is reduced.

In other words, by placing the compact, unified insulating substrate 100 in parallel in the casing 200, the assembly process of the insulating substrate 100 may be facilitated, and as the size of the insulating substrate 100 is reduced, the performance and reliability of the power module may be improved.

For convenience in explanation and accurate definition in the appended claims, the terms "upper", "lower", "inner", "outer", "up", "down", "upwards", "downwards", "front", "rear", "back", "inside", "outside", "inwardly", "outwardly", "interior", "exterior", "internal", "external", "forwards", and "backwards" are used to describe features of the exemplary embodiments with reference to the positions of such features as displayed in the figures. It will be further understood that the term "connect" or its derivatives refer both to direct and indirect connection.

The foregoing descriptions of specific exemplary embodiments of the present disclosure have been presented for purposes of illustration and description. They are not intended to be exhaustive or to limit the present disclosure to the precise forms disclosed, and obviously many modifications and variations are possible in light of the above teachings. The exemplary embodiments were chosen and described in order to explain certain principles of the invention and their practical application, to enable others skilled in the art to make and utilize various exemplary embodiments of the present disclosure, as well as various alternatives and modifications thereof. It is intended that the scope of the present disclosure be defined by the Claims appended hereto and their equivalents.

What is claimed is:

1. A power module, comprising:

insulating substrates, to each of which a corresponding chip is bonded; and a casing provided with mounting portions into which the insulating substrates are respectively inserted, and provided with a bus bar electrically connected to the insulating substrates inserted into the mounting portions, wherein the mounting portions are provided to support the insulating substrates, and wherein the casing is configured in plurality and combined to be stacked, and the casings are spaced apart in a stacking direction so that the respective insulating substrates of the casings do not come into contact with each other.

2. The power module of claim 1, wherein the mounting portions are disposed in a straight line in the casing, and the bus bar is provided to extend in a direction in which the mounting portions are disposed.

3. The power module of claim 1, wherein the insulating substrates and the bus bar are electrically connected to each other via connection portions to form an electric circuit therebetween.

4. The power module of claim 3, wherein the bus bar is provided each on a first side and a second side of the casing and is electrically connected to the insulating substrates respectively inserted into the mounting portions.

5. The power module of claim 4, wherein any one insulating substrate is electrically connected to the bus bar on the first side via a connection portion among the connection portions, the insulating substrate electrically connected to the bus bar is connected to another insulating substrate via a connection portion among the connection portions, and the another insulating substrate is electrically connected to the bus bar on the second side.

6. The power module of claim 1, wherein a plurality of protruding end portions are formed along a periphery of each of the casings, and when the casings are combined, the respective protruding end portions of the casings are matched.

7. The power module of claim 1, wherein in a state in which the casings are combined, respective bus bars of the casings are arranged to cross each other in the stacking direction thereof.

8. The power module of claim 1, wherein a plurality of signal pins are provided in the casing, and the plurality of signal pins are spaced from the bus bar.

9. The power module of claim 8, wherein the bus bar is disposed each on a first side and a second side of the casing, and the signal pins are spaced in a direction perpendicular to a direction where the bus bar is disposed.

10. The power module of claim 1, wherein the casing is molded with the insulating substrates inserted into the mounting portions to be internally insulated.

11. A power module, comprising:

a lower casing provided with a plurality of first mounting portions into which a plurality of first insulating substrates to which chips are bonded are inserted, and provided with a first bus bar electrically connected to the first insulating substrates inserted into the first mounting portions; and an upper casing provided with a plurality of second mounting portions into which a plurality of second insulating substrates to which chips are bonded are inserted, and provided with a second bus bar electrically connected to the second insulating substrates inserted into the second mounting portions, wherein the lower casing and the upper casing are vertically coupled, and wherein the first bus bar is provided each on a first side and a second side of the lower casing, while the second bus bar is provided each on a first side and a second side of the upper casing, and the first bus bar and the second bus bar are disposed to cross each other in a vertical direction thereof.

12. The power module of claim 11, wherein in the lower casing, the first insulating substrates and the first bus bar are electrically connected to each other via first connection portions, while in the upper casing, the second insulating substrates and the second bus bar are electrically connected to each other via second connection portions.

13. The power module of claim 11, wherein a plurality of signal pins are provided in the lower casing and the upper casing, and the plurality of signal pins are disposed in a direction perpendicular to the first bus bar and the second bus bar.

* * * * *